(12) United States Patent
Gendai

(10) Patent No.: US 10,826,451 B2
(45) Date of Patent: Nov. 3, 2020

(54) COMBINED RESISTANCE CIRCUIT AND VARIABLE GAIN AMPLIFIER CIRCUIT

(71) Applicant: THINE ELECTRONICS, INC., Chiyoda-ku, Tokyo (JP)

(72) Inventor: Yuji Gendai, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 63 days.

(21) Appl. No.: 16/152,505

(22) Filed: Oct. 5, 2018

(65) Prior Publication Data

US 2019/0109571 A1    Apr. 11, 2019

(30) Foreign Application Priority Data

Oct. 6, 2017 (JP) ................... 2017-196100

(51) Int. Cl.
  *H03F 3/45* (2006.01)
  *H03G 1/00* (2006.01)
  *H03G 3/00* (2006.01)

(52) U.S. Cl.
  CPC ....... *H03G 1/0088* (2013.01); *H03F 3/45273* (2013.01); *H03F 3/45475* (2013.01); *H03G 1/007* (2013.01); *H03G 1/0029* (2013.01); *H03G 3/001* (2013.01); *H03F 2203/45526* (2013.01); *H03F 2203/45528* (2013.01)

(58) Field of Classification Search
  CPC .... H03G 1/0088; H03G 1/0029; H03G 3/001; H03G 1/007; H03F 3/45475; H03F 3/45273; H03F 2203/45528; H03F 2203/45526; H03F 1/56
  USPC .................. 330/254, 144, 86, 282, 284, 278
  See application file for complete search history.

(56) References Cited

FOREIGN PATENT DOCUMENTS

JP    2008205560 A    9/2008
JP    2011091572 A    5/2011

*Primary Examiner* — Khanh V Nguyen
*Assistant Examiner* — Khiem D Nguyen
(74) *Attorney, Agent, or Firm* — Sughrue Mion, PLLC

(57) ABSTRACT

A combined resistance circuit 2A includes a first circuitry 20A provided between a first end 2a and a second end 2b. This first circuitry 20A includes a resistor R1 provided between a node N11 and a node N12, a resistor R2 provided between the node N12 and a node N13, a resistor R3 provided between the node N13 and a node N14, a resistor R4 provided between the node N14 and the node N11, a resistor R5 provided between the node N11 and the node N13, a switch SW0 provided in series to the resistor R4 between the node N14 and the node N11, and a switch SW1 provided in series to the resistor R2 between the node N12 and the node N13. The node N12 is connected to the first end and the node N14 is connected to the second end.

6 Claims, 11 Drawing Sheets

Fig.2

| CONTROL SIGNAL | | SWITCH | | COMBINED RESISTANCE VALUE (Ω) |
|---|---|---|---|---|
| b1 | b0 | SW1 | SW0 | |
| 0 | 0 | off | off | 5948.3 |
| 0 | 1 | off | on | 4962.7 |
| 1 | 0 | on | off | 4132.9 |
| 1 | 1 | on | on | 3435.1 |

Fig.4

| CONTROL SIGNAL | | | SWITCH | | | | | COMBINED RESISTANCE VALUE (Ω) |
|---|---|---|---|---|---|---|---|---|
| b2 | b1 | b0 | SW4 | SW3 | SW2 | SW1 | SW0 | |
| 0 | 0 | 0 | off | off | off | off | off | 5948.3 |
| 0 | 0 | 1 | off | off | off | off | on | 4962.7 |
| 0 | 1 | 0 | off | off | off | on | off | 4132.9 |
| 0 | 1 | 1 | off | off | off | on | on | 3435.1 |
| 1 | 0 | 0 | off | off | on | off | off | 2848.9 |
| 1 | 0 | 1 | off | on | on | off | on | 2356.6 |
| 1 | 1 | 0 | on | off | on | on | off | 1943.1 |
| 1 | 1 | 1 | on | on | on | on | on | 1595.6 |

Fig.7

| CONTROL SIGNAL | | | SWITCH | | | COMBINED RESISTANCE VALUE (Ω) |
|---|---|---|---|---|---|---|
| b2 | b1 | b0 | SW2 | SW1 SW4 | SW0 SW3 | |
| 0 | 0 | 0 | off | off | off | 5948.3 |
| 0 | 0 | 1 | off | off | on | 4962.7 |
| 0 | 1 | 0 | off | on | off | 4132.9 |
| 0 | 1 | 1 | off | on | on | 3435.1 |
| 1 | 0 | 0 | on | off | off | 2848.9 |
| 1 | 0 | 1 | on | off | on | 2356.6 |
| 1 | 1 | 0 | on | on | off | 1943.1 |
| 1 | 1 | 1 | on | on | on | 1595.6 |

US 10,826,451 B2

COMBINED RESISTANCE CIRCUIT AND VARIABLE GAIN AMPLIFIER CIRCUIT

TECHNICAL FIELD

The present invention relates to a combined resistance circuit and a variable gain amplifier circuit including the same.

BACKGROUND

A variable gain amplifier circuit has a combined resistance circuit of which resistance value is variable, and may output an electrical signal having a value corresponding to a value of an input electrical signal and a resistance value of the combined resistance circuit. The variable gain amplifier circuit includes a voltage amplifying circuit that amplifies an input voltage signal and outputs the amplified voltage signal, a VI converting circuit that converts an input voltage signal into a current signal and outputs the current signal, and an IV converting circuit that converts an input current signal into a voltage signal and outputs the voltage signal, and the like.

The invention of such a variable gain amplifier circuit is disclosed in Patent Document 1 and Patent Document 2 described below. The combined resistance circuit included in the variable gain amplifier circuit disclosed in Patent Document 1 has a configuration in which a plurality of constituent units are connected in parallel, with a resistor and a switch connected in series as a constituent unit (hereinafter referred to as "parallel configuration"). The combined resistance circuit included in the variable gain amplifier circuit disclosed in Patent Document 2 has a configuration in which a plurality of constituent units are connected in series, with the resistor and the switch connected in parallel as a constituent unit (hereinafter referred to as "series configuration").

Patent Document 1: Japanese Unexamined Patent Publication No. 2008-205560;
Patent Document 2: Japanese Unexamined Patent Publication No. 2011-091572.

SUMMARY

In general, a switch used in both a parallel configuration and a series configuration is an analog switch composed of MOS transistors. The combined resistance circuit has a resistance value according to the turned-on/turned-off state of each of a plurality of digitally controlled switches. When it is assumed that the number of constituent units connected in parallel or in series is n, there are $2^n$ combinations of turned-on/turned-off states of each of the n number of switches. However, it is not easy to set the resistance value of each of the n number of resistors so that the combined resistance circuit may have the desired resistance value as $2^n$. Therefore, conventionally, it is necessary to connect many constituent units in parallel or in series in order to allow the combined resistance circuit to have each desired resistance value in both the parallel configuration and the series configuration.

The present invention is made in order to solve the above-described problem, and an object thereof is to provide a combined resistance circuit that may have many desirable resistance values using a small number of switches. It is a further object of the present invention to provide the variable gain amplifier circuit having such the combined resistance circuit.

A combined resistance circuit of the present invention includes a first circuitry provided between a first end and a second end. The first circuitry includes a resistor R1 provided between a node N11 and a node N12, a resistor R2 provided between the node N12 and a node N13, a resistor R3 provided between the node N13 and a node N14, a resistor R4 provided between the node N14 and the node N11, a resistor R5 provided between the node N11 and the node N13, a switch SW0 provided in series to the resistor R4 between the node N14 and the node N11, and a switch SW1 provided in series to the resistor R2 between the node N12 and the node N13. The node N12 is connected to the first end, and the node N14 is connected to the second end.

In the combined resistance circuit of the present invention, a resistance ratio $(r_3/r_1)$ and a resistance ratio $(r_4/r_2)$ are preferably equal to each other, when a resistance value of the resistor R1 is $r_1$, a resistance value of the resistor R2 is $r_2$, a resistance value of the resistor R3 is $r_3$, and a resistance value of the resistor R4 is $r_4$.

The combined resistance circuit of the present invention preferably further includes a second circuitry provided in parallel to the first circuitry between the first end and the second end. The second circuitry includes a resistor R6 provided between a node N21 and a node N22, a resistor R7 provided between the node N22 and a node N23, a resistor R8 provided between the node N23 and a node N24, a resistor R9 provided between the node N24 and the node N21, a resistor R10 provided between the node N21 and the node N23, a switch SW2 provided in series to the resistor R6 between the node N21 and the node N22, a switch SW3 provided in series to the resistor R9 between the node N24 and the node N21, and a switch SW4 provided in series to the resistor R7 between the node N22 and the node N23. The node N22 is connected to the first end, and the node N24 is connected to the second end.

The combined resistance circuit of the present invention preferably further includes a third circuitry provided in parallel to the third circuitry between the first end and the second end. The first circuitry includes a resistor R6 provided between a node N21 and a node N22, a resistor R7 provided between the node N22 and a node N23, a resistor R8 provided between the node N23 and a node N24, a resistor R9 provided between the node N24 and the node N21, a resistor R10 provided between the node N21 and the node N23, a switch SW2 provided in series to the resistor R10 between the node N21 and the node N23, a switch SW3 provided in series to the resistor R9 between the node N24 and the node N21, and a switch SW4 provided in series to the resistor R7 between the node N22 and the node N23. The node N22 is connected to the first end, and the node N24 is connected to the second end.

The combined resistance circuit of the present invention preferably further includes a fourth circuitry provided in parallel to the fourth circuitry between the first end and the second end. The first circuitry includes a resistor R6 provided between a node N21 and a node N22, a resistor R7 provided between the node N22 and a node N23, a resistor R8 provided between the node N23 and a node N24, a resistor R9 provided between the node N24 and the node N21, a resistor R10 provided between the node N21 and the node N23, a switch SW2 provided between the node N24 and the second end, a switch SW3 provided in series to the resistor R9 between the node N24 and the node N21, and a switch SW4 provided in series to the resistor R7 between the node N22 and the node N23. The node N22 is connected to the first end.

A variable gain amplifier circuit of the present invention includes the combined resistance circuit of the present invention described above and outputs an electrical signal having a value corresponding to a value of an input electrical signal and a combined resistance value of the combined resistance circuit.

The combined resistance circuit of the present invention may have many desirable resistance values using a small number of switches.

BRIEF DESCRIPTION OF DRAWINGS

FIG. 2 is a table summarizing combined resistance values for respective values of control signals in combined resistance circuit according to the first configuration example.

FIG. 4 is a table summarizing a combined resistance value for respective values of control signals in the combined resistance circuit according to the second configuration example.

FIG. 7 is a table summarizing a combined resistance value for respective values of control signals in the combined resistance circuit according to the fourth configuration example.

DESCRIPTION OF EMBODIMENTS

Figure 1:
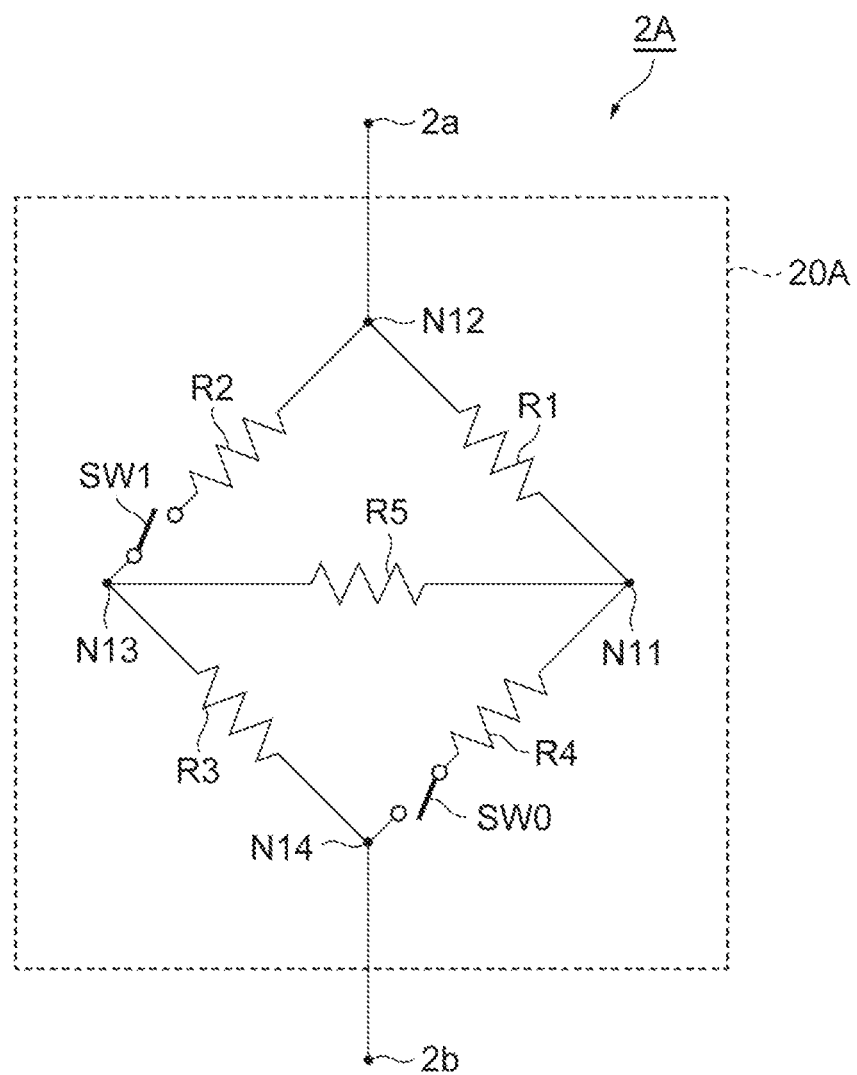
FIG. 1 is a circuit diagram showing a combined resistance circuit according to a first configuration example.

Hereinafter, an embodiment for carrying out the present invention will be described in detail with reference to the accompanying drawings. In the description of the drawings, the same elements are denoted by the same reference numerals, and duplicate descriptions are not repeated. The present invention is not limited to these embodiments but is intended to be indicated by the claims and includes all modifications within the scope and meaning equivalent to the claims.

Hereinafter, first to fourth configuration examples and modification examples of the combined resistance circuit will be described, followed by first to fourth configuration example and modification example of the variable gain amplifier circuit including this combined resistance circuit will be described.

First Configuration Example of Combined Resistance Circuit

FIG. 1 is the circuit diagram showing a combined resistance circuit 2A according to the first configuration example. The combined resistance circuit 2A includes a first circuitry 20A between a first end 2a and a second end 2b. The first circuitry 20A includes resistors R1 to R5 and switches SW0 and SW1.

A resistor R1 is provided between a node N11 and a node N12. A resistor R2 and a switch SW1 are connected in series to each other and are provided between the node N12 and a node N13. A resistor R3 is provided between the node N13 and a node N14. A resistor R4 and a switch SW0 are connected in series to each other and are provided between the node N14 and the node N11. A resistor R5 is provided between the node N11 and the node N13. The node N12 is connected to the first end 2a. Node N14 is connected to the second end 2b. The combined resistance circuit 2A may have a combined resistance value according to a turned-on/turned-off states of each of the two switches SW0 and SW1 between the first end 2a and the second end 2b.

A control signal that controls turned-on/turned-off of each of the two switches SW0 and SW1 may be represented by a 2-bit binary number (b1, b0). The switch SW0 is in an off state when b0=0, and is in an on state when b0=1. The switch SW1 is in the off state when b1=0, and is in the on state when b1=1. In this example, a circuit for decoding the control signal is unnecessary.

The resistance value of the resistor R1 is set as $r_1$. The resistance value of the resistor R2 is set as $r_2$. The resistance value of the resistor R3 is set as $r_3$. The resistance value of the resistor R4 is set as $r_4$. The resistance value of the resistor R5 is set as $r_5$. When the control signal is a value 00b, both the switch SW1 and the switch SW0 are in the off state, and a combined resistance value $r_{00b}$ of a combined resistance circuit 2A is expressed by the following equation (1). When the control signal is a value 01b, the switch SW1 is in the off state, the switch SW0 is in the on state, and a combined resistance value $r_{01b}$ of a combined resistance circuit 2A is expressed by the following equation (2). When the control signal is a value 10b, the switch SW1 is in the on state, the switch SW0 is in the off state, and a combined resistance value $r_{10b}$ of a combined resistance circuit 2A is expressed by the following equation (3). When the control signal is a value 11b, both the switch SW1 and the switch SW0 are in the on state, and a combined resistance value $r_{11b}$ of a combined resistance circuit 2A is expressed by the following equation (4). In the equations (2) and (3), the operator "//" represents an operation of obtaining a combined resistance value of a resistance circuit in which the resistor of a resistance value x and the resistor of a resistance value y are connected in parallel by the equation of $x//y=xy/(x+y)$.

$$r_{00b} = r_1 + r_5 + r_3 \tag{1}$$

$$r_{01b} = r_1 + (r_5 + r_3)//r_4 \tag{2}$$

$$r_{10b} = (r_1 + r_5)/r_2 + r_3 \tag{3}$$

$$r_{11b} = \frac{r_3 r_4 r_5 + r_2 r_4 r_5 + r_1 r_3 r_5 + r_1 r_2 r_5 + r_2 r_3 r_4 + r_1 r_3 r_4 + r_1 r_2 r_4 + r_1 r_2 r_3}{r_4 r_5 + r_3 r_5 + r_2 r_5 + r_1 r_5 + r_2 r_4 + r_1 r_4 + r_2 r_3 + r_1 r_3} \tag{4}$$

The resistance values $r_1$ to $r_5$ of the resistors R1 to R5 may be set so that the combined resistance values $r_{00b}$, $r_{01b}$, $r_{10b}$, $r_{11b}$ become desired values. For example, as shown by the following equations (5a), (5b) and (5c), the resistance values $r_1$ to $r_5$ of the resistors R1 to R5 may be set so that the combined resistance values $r_{00b}$, $r_{01b}$, $r_{10b}$, $r_{11b}$ become the geometric progression of the common ratio m.

$$r_{01b} = mr_{00b} \quad (5a)$$

$$r_{10b} = m^2 r_{00b} \quad (5b)$$

$$r_{11b} = m^3 r_{00b} \quad (5c)$$

While there are five unknowns (resistance values $r_1$ to $r_5$), since there are four equations (equations (1) to (4) above), there are cases where the resistance values $r_1$ to $r_5$ may not be uniquely determined. It is preferable to provide a constraint of having the resistance ratio ($r_3/r_1$) and the resistance ratio ($r_4/r_2$) equal to each other, that is, a constraint of satisfying the relationship expressed by the following equations (6a) and (6b). By setting such constraints, the number of unknowns can be four. In determining the resistance values $r_1$ to $r_5$, mathematical expression processing software can be used.

$$r_3 = k\, r_1 \quad (6a)$$

$$r_4 = kr_2 \quad (6b)$$

An example of the resistance values $r_1$ to $r_5$ of the resistors R1 to R5 is as follows.

$$r_1 = 3842.04\ \Omega$$

$$r_2 = 7670.18\ \Omega$$

$$r_3 = 1200.54\ \Omega$$

$$r_4 = 2399.02\ \Omega$$

$$r_5 = 906.028\ \Omega$$

FIG. 2 is a table summarizing combined resistance values for respective values of the control signal when the resistors R1 to R5 having these resistance values are used. FIG. 2 also shows the turned-on/turned-off states of the switches SW0 and SW1 according to respective values of the control signal. Although the combined resistance values shown in FIG. 2 is slightly different from the geometric progression, but this is because each resistance value is corrected so that the gain accurately becomes a geometric progression when the combined resistance circuit is applied to the actual variable gain amplifier circuit. Such correction is preferably performed for each circuit.

When a resistor and a switch are provided in series between two nodes and the on-resistance value of the switch may not be ignored, it is preferable to set the resistance value of the resistor so that the sum of the resistance value of the resistor and the on-resistance value of the switch becomes the above value.

The combined resistance circuit 2A of this configuration example may have four desired combined resistance values using two switches. Since the number of the switches is small, the effect of parasitic capacitance may be suppressed. Since a decode circuit is unnecessary and the resistance matrix is small, the layout area may be reduced when the combined resistance circuit 2A is formed on a semiconductor substrate.

Second Configuration Example of Combined Resistance Circuit

Figure 3:
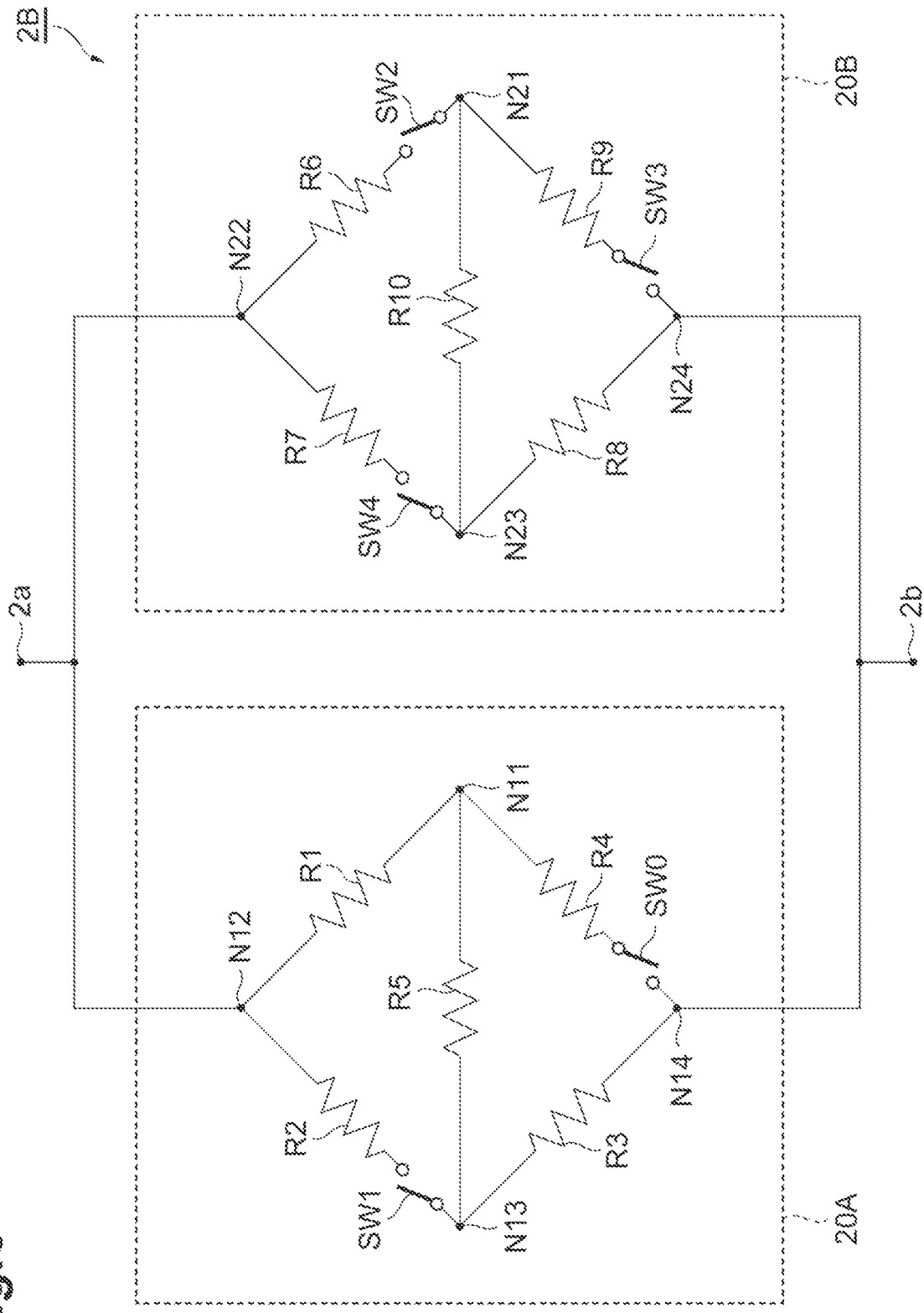
FIG. 3 is a circuit diagram showing a combined resistance circuit according to a second configuration example.

FIG. 3 is a circuit diagram showing a combined resistance circuit 2B according to a second configuration example. The combined resistance circuit 2B includes a first circuitry 20A and a second circuitry 20B between a first end 2a and a second end 2b. Compared to the configuration of the combined resistance circuit 2A of the first configuration example shown in FIG. 1, the combined resistance circuit 2B of the second configuration example shown in FIG. 3 is different in that the second circuitry 20B is additionally provided between the first end 2a and the second end 2b. The second circuitry 20B is provided in parallel to the first circuitry 20A. The second circuitry 20B includes resistors R6 to R10 and switches SW2 to SW4.

The resistor R6 and the switch SW2 are connected in series to each other and are provided between a node N21 and a node N22. The resistor R7 and the switch SW4 are connected in series to each other and are provided between the node N22 and a node N23. The resistor R8 is provided between the node N23 and the node N24. The resistor R9 and the switch SW3 are connected in series to each other and are provided between the node N24 and the node N21. The resistor R10 is provided between the node N21 and the node N23. The node N22 is connected to the first end 2a. The node N24 is connected to the second end 2b. The combined resistance circuit 2B may have a combined resistance value according to the turned-on/turned-off state of each of the five switches SW0 to SW4 between the first end 2a and the second end 2b.

As an example, the control signal that controls turned-on/turned-off of each of the five switches SW0 to SW4 may be represented by a 3-bit binary number (b2, b1, b0). The switch SW0 is in the off state when b0=0, and is in the on state when b0=1. The switch SW1 is in the off state when b1=0, and is in the on state when b1=1. The switch SW2 is in the off state when b2=0 and is in the on state when b2=1. The switch SW3 is in the off state when b0 & b2=0, and is in the on state when b0 & b2=1. The switch SW4 is in the off state when b1 & b2=0, and is in the on state when b1 & b2=1. The operator "&" represents an operation for obtaining a product.

In this example, a decoding circuit is used. The decode circuit is inputted with a control signal expressed by a 3-bit binary number (b2, b1, b0). Then, the decode circuit outputs a value of the logical product of the bits b0 and b2 to the switch SW3, and outputs the value of the logical product of the bits b1 and b2 to the switch SW4.

When b2=0, since all of the three switches SW2 to SW4 in the second circuitry 20B are in an off state, the combined resistance value of the combined resistance circuit 2B becomes the combined resistance value of the first circuitry 20A according to respective values of the bits b1 and b0 as in the case of the first configuration example. When b2=1, the combined resistance value of the combined resistance circuit 2B becomes the combined resistance value of the first circuitry 20A and the second circuitry 20B connected in parallel. When b2=1, the combined resistance value of the second circuitry 20B becomes the value according to respective values of the bits b1 and b0. The resistance values $r_6$ to $r_{10}$ of the resistors R6 to R10 of the second circuitry 20B may be set in the same manner as the setting method of the resistance values $r_1$ to $r_5$ of the first circuitry 20A in the first configuration example.

An example of the resistance values $r_1$ to $r_{10}$ of the resistors R1 to R10 is as follows.

$$r_1 = 3842.04\ \Omega$$

$$r_2 = 7670.18\ \Omega$$

$$r_3 = 1200.54\ \Omega$$

$$r_4 = 2399.02\ \Omega$$

$$r_5 = 906.028\ \Omega$$

$$r_6 = 3497.20\ \Omega$$

$r_7 = 5948.26 \, \Omega$ $r_8 = 1172.25 \, \Omega$ $r_9 = 1993.024 \, \Omega$ $r_{10} = 797.874 \, \Omega$ As described above, the resistance ratio $(r_3/r_1)$ and the resistance ratio $(r_4/r_2)$ are equal to each other $((r_3/r_1)=(r_2/r_4)=1)$, when the resistance value of the resistor R1 is $r_1$, the resistance value of the resistor R2 is $r_2$, the resistance value of the resistor R3 is $r_3$, and the resistance value of the resistor R4 is $r_4$. Similarly, the resistance ratio $(r_8/r_6)$ and the resistance ratio $(r_9/r_7)$ are equal to each other $((r_8/r_6) \times (r_7/r_9) = 1)$, when the resistance value of the resistor R6 is $r_6$, the resistance value of the resistor R7 is $r_7$, the resistance value of the resistor R8 is $r_8$, and the resistance value of the resistor R9 is $r_9$. In addition, equal resistance ratio means that they are substantially equal. In the above case, the degree of coincidence $S = (r_3/r_1) \times (r_2/r_4) = 0.99904819582 \approx 1$, and the degree of coincidence $S = (r_8/r_6) \times (r_7/r_9) = 1.00040807041 \approx 1$. Therefore, if the degree of coincidence S is within the range of $S = 1 \pm 0.001$, the above resistance ratios may be considered to be substantially equal. Further, the above resistance ratios may be considered to be substantially equal if the coincidence S is designed to be 1 and the actual coincidence S is shifted from 1 because of the manufacturing variation. The coincidence S may be within the range of $1 \pm 0.1$. However, this is an example of coincidence and the invention is not limited by the example.

FIG. 4 is a table summarizing combined resistance values for respective values of the control signal when the resistors R1 to R10 having these resistance values are used. FIG. 4 also shows the turned-on/turned-off states of the switches SW0 and SW4 according to respective values of the control signal.

When a resistor and a switch are provided in series between two nodes and the on-resistance value of the switch may not be ignored, it is preferable to set the resistance value of the resistor so that the sum of the resistance value of the resistor and the on-resistance value of the switch becomes the above value.

The combined resistance circuit 2B of this configuration example may have at least eight desired combined resistance values using the five switches. Since the number of the switches is small, the effect of parasitic capacitance may be suppressed. Since the configuration of the decode circuit is simple and the resistance matrix is small, it is possible to reduce the layout area when forming the combined resistance circuit 2B on the semiconductor substrate.

Third Configuration Example of Combined Resistance Circuit

Figure 5:
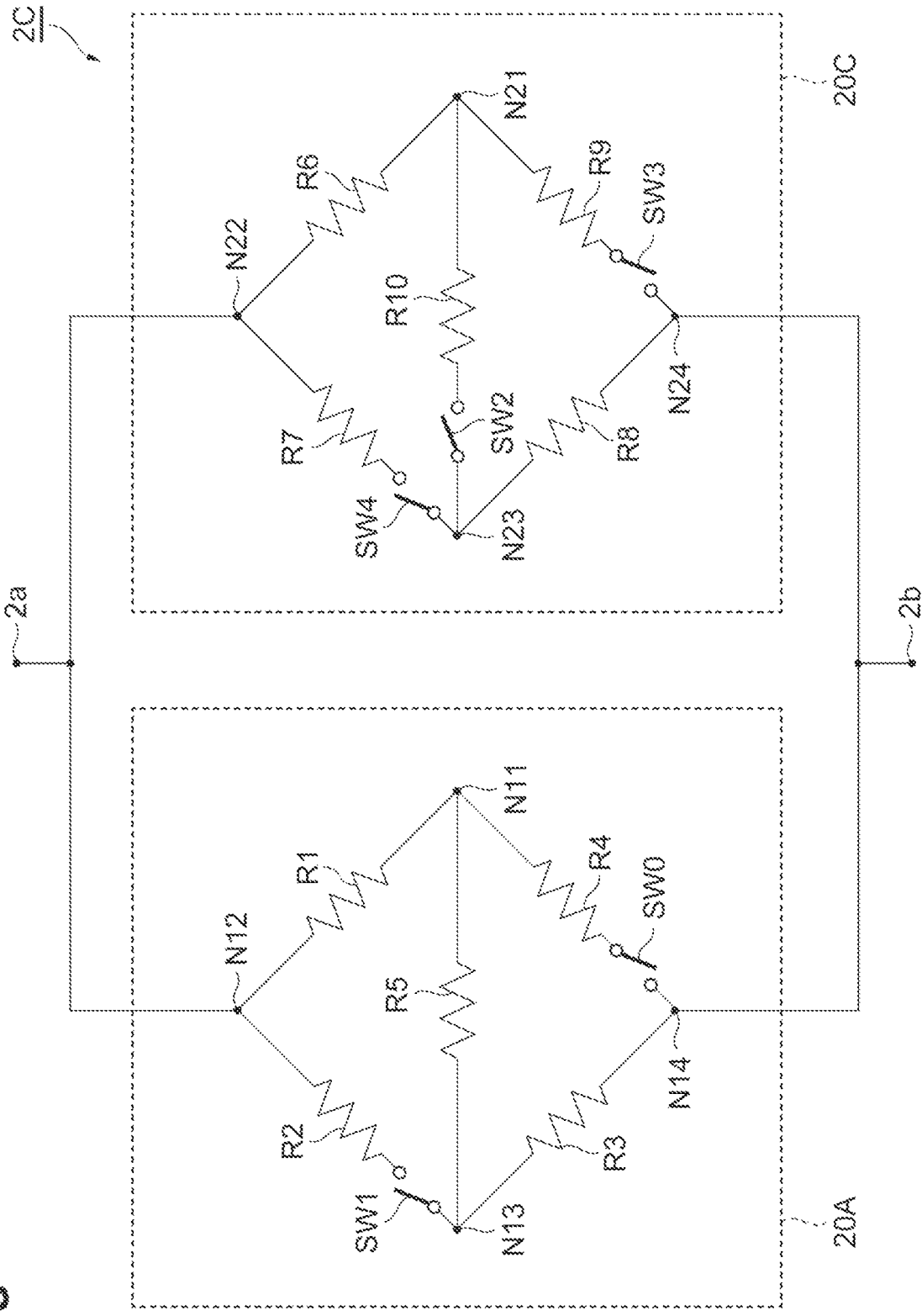
FIG. 5 is a circuit diagram showing a combined resistance circuit according to a third configuration example.

FIG. 5 is a circuit diagram showing a combined resistance circuit 2C according to a third configuration example. The combined resistance circuit 2C includes the first circuitry 20A and a third circuitry 20C between the first end 2a and the second end 2b. Compared to the configuration of the combined resistance circuit 2B of the second configuration example shown in FIG. 3, the combined resistance circuit 2C of the third configuration example shown in FIG. 5 is different in that the third circuitry 20C is provided instead of the second circuitry 20B. The third circuitry 20C is provided in parallel to the first circuitry 20A. The third circuitry 20C includes resistors R6 to R10 and switches SW2 to SW4.

In the second circuitry 20B in the second configuration example, the switch SW2 is connected in series to the resistor R6 and provided between the node N21 and the node N22. On the other hand, in the third circuitry 20C in the third configuration example, the switch SW2 is connected in series to the resistor R10 and is provided between the node N21 and the node N23. The combined resistance circuit 2C may have a combined resistance value according to the turned-on/turned-off state of each of the five switches SW0 to SW4 between the first end 2a and the second end 2b.

Likewise the combined resistance circuit 2B of the second configuration example as shown in FIG. 4, in the combined resistance circuit 2C of the third configuration example, as an example, the control signal that controls turned-on/turned-off of each of the five switches SW0 to SW4 can be represented by a 3-bit binary number (b2, b1, b0), and the combined resistance value according to respective values of the control signal may also be set by setting respective resistance value of the resistors R1 to R10.

The combined resistance circuit 2C of this configuration example may have at least eight desired combined resistance values using the five switches. Since the number of the switches is small, the effect of parasitic capacitance may be suppressed. Since the configuration of the decode circuit is simple and the resistance matrix is small, it is possible to reduce the layout area when forming the combined resistance circuit 2C on the semiconductor substrate.

Fourth Configuration Example of Combined Resistance Circuit

Figure 6:
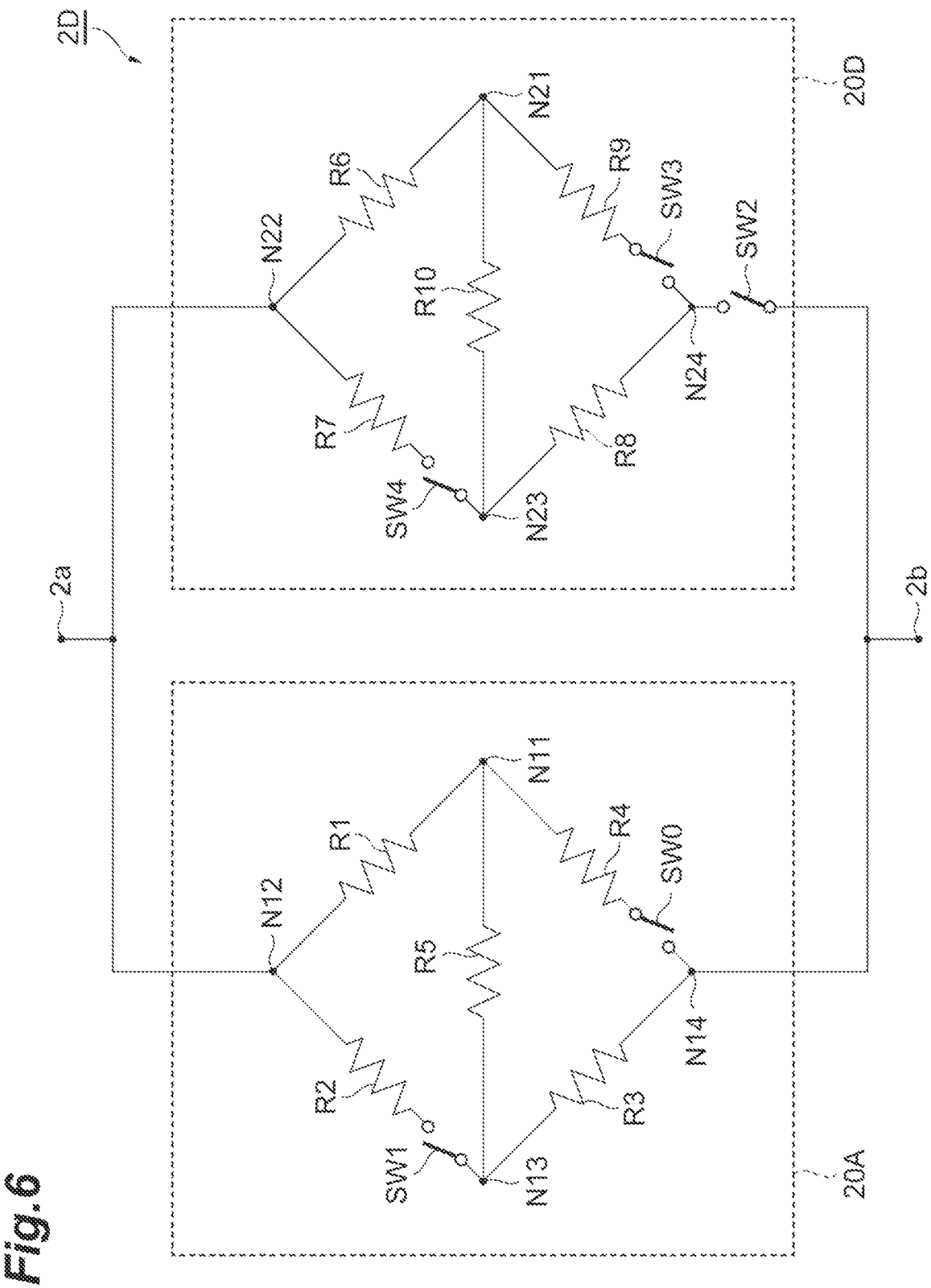
FIG. 6 is a circuit diagram showing a combined resistance circuit according to a fourth configuration example.

FIG. 6 is the circuit diagram showing a combined resistance circuit 2D according to a fourth configuration example. The combined resistance circuit 2D includes the first circuitry 20A and a fourth circuitry 20D between the first end 2a and the second end 2b. Compared to the configuration of the combined resistance circuit 2B of the second configuration example shown in FIG. 3, the combined resistance circuit 2D of the fourth configuration example shown in FIG. 6 is different in that the fourth circuitry 20D is provided instead of the second circuitry 20B. The fourth circuitry 20D is provided in parallel to the first circuitry 20A. The fourth circuitry 20D includes the resistors R6 to R10 and switches SW2 to SW4.

In the second circuitry 20B in the second configuration example, the switch SW2 is connected in series to the resistor R6 and provided between the node N21 and the node N22. On the other hand, in the fourth circuitry 20D in the fourth configuration example, the switch SW2 is provided between the node N24 and the second end 2b. The combined resistance circuit 2D may have a combined resistance value according to the turned-on/turned-off state of each of the five switches SW0 to SW4 between the first end 2a and the second end 2b.

As an example, the control signal that controls turned-on/turned-off of each of the five switches SW0 to SW4 may be represented by a 3-bit binary number (b2, b1, b0). The switch SW0 and the switch SW3 are in the off state when b0=0, and are in the on state when b0=1. The switch SW1 and the switch SW4 are in the off state when b1=0 and are in the on state when b1=1. The switch SW2 is in the off state when b2=0 and is in the on state when b2=1. In this example, a circuit for decoding the control signal is unnecessary.

When b2=0, since the switches SW2 in the fourth circuitry 20D is in an off state, the combined resistance value of the combined resistance circuit 2D becomes the combined resistance value of the first circuitry 20A according to respective values of the bits b1 and b0 as in the case of the first configuration example. When b2=1, the combined resistance value of the combined resistance circuit 2D becomes the combined resistance value of the first circuitry 20A and the fourth circuitry 20D connected in parallel. When b2=1, the combined resistance value of the fourth circuitry 20D becomes the value according to respective values of the bits b1 and b0.

Likewise the combined resistance circuit 2B of the second configuration example, in the combined resistance circuit 2D of the fourth configuration example, the control signal that controls turned-on/turned-off of each of the five switches SW0 to SW4 may also be represented by a 3-bit binary number (b2, b1, b0), and a combined resistance value according to respective values of the control signal may be set by setting each resistance value of the resistors R1 to R10. FIG. 7 is a table summarizing combined resistance values for respective values of the control signal when the resistors R1 to R10 having these resistance values are used. FIG. 7 also shows the turned-on/turned-off states of the switches SW0 and SW4 according to respective values of the control signal.

When a resistor and a switch are provided in series between two nodes and the on-resistance value of the switch may not be ignored, it is preferable to set the resistance value of the resistor so that the sum of the resistance value of the resistor and the on-resistance value of the switch becomes the above value. When the on-resistance value of the switch SW2 may not be ignored, it is preferable to set the resistance values $r_6$ to $r_{10}$ of the resistors R6 to R10 so that the sum of the combined resistance value between the nodes N22 and N24 and the on-resistance value of the switch SW2 becomes a desired value.

The combined resistance circuit 2D of this configuration example may have at least eight desired combined resistance values using the five switches. Since the number of switches is small, the effect of parasitic capacitance may be suppressed. Since a decode circuit is unnecessary and the resistance matrix is small, the layout area may be reduced when the combined resistance circuit 2D is formed on a semiconductor substrate.

Modification Example of Combined Resistance Circuit

The combined resistance circuit of the present invention is not limited to the combined resistance circuits 2A to 2D of the first to fourth configuration examples and various modifications are possible. For example, in the second configuration example, the switch SW2 may be provided between the node N23 and the node N24 instead of the configuration in which the switch SW2 is provided between the node N21 and the node N22, and such a configuration is also equivalent. Further, in the fourth configuration example, the switch SW2 may be provided between the node N22 and the first end 2a instead of providing the switch SW2 between the node N24 and the second end 2b, and such a configuration is also equivalent.

The combined resistance circuit of the present invention may have a configuration in which two or more circuitries of the same kind or different kinds among the second circuitry 20B, the third circuitry 20C, and the fourth circuitry 20D are connected to the first circuitry 20A in parallel. The combined resistance circuit of the present invention may have a configuration in which the resistor is connected in series or in parallel to the first circuitry 20A. The combined resistance circuit of the present invention may have a configuration in which the resistors and the switches connected in series or in parallel to each other are connected in parallel to the first circuitry 20A.

The resistors R1 to R10 may be a single resistor or a configuration in which a plurality of resistors are connected in series or in parallel. When forming the resistor on a semiconductor substrate, there is a certain range of resistance values that are easy to realize, and therefore, in order to realize a resistance value out of that range, it is preferable to connect a plurality of resistors having a resistance value within that range in series or in parallel.

First Configuration Example of Variable Gain Amplifier Circuit

Figure 8:
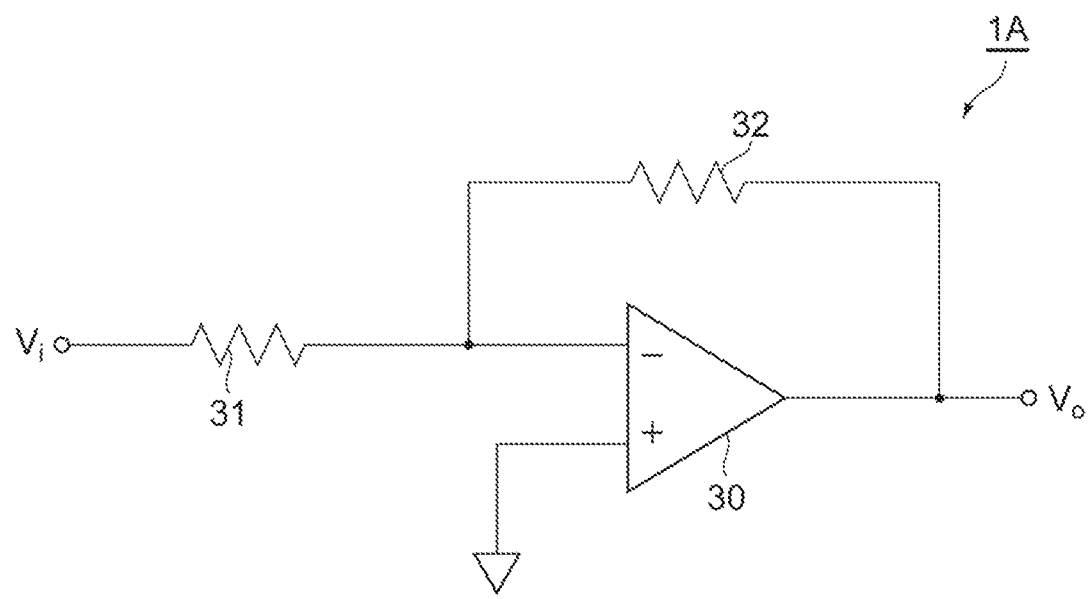
FIG. 8 is a circuit diagram showing a variable gain amplifier circuit according to the first configuration example.

FIG. 8 is a circuit diagram showing a variable gain amplifier circuit 1A according to the first configuration example. The variable gain amplifier circuit 1A includes an operational amplifier 30 and resistors 31 and 32. A non-inverting input terminal of the operational amplifier 30 is connected to a ground potential input terminal. A resistor 31 is provided between an inverting input terminal of the operational amplifier 30 and an input terminal of the variable gain amplifier circuit 1A. A resistor 32 is provided between the inverting input terminal of the operational amplifier 30 and an output terminal of the operational amplifier 30. The output terminal of the operational amplifier 30 is connected to the output terminal of the variable gain amplifier circuit 1A.

A value Vo of the voltage signal outputted from the output terminal becomes a value corresponding to a value Vi of a voltage signal inputted to the input terminal, a resistance value $r_{31}$ of the resistor 31 and a resistance value $r_{32}$ of the resistor 32. The output voltage value Vo is expressed by the following equation (7).

$$Vo = -\frac{r_{32}}{r_{31}} Vi \tag{7}$$

Both or one of the resistor 31 and the resistor 32 has the configuration of the combined resistance circuit described above. As a result, the variable gain amplifier circuit 1A becomes an inverting amplifier circuit in which the gain is variably set.

Second Configuration Example of Variable Gain Amplifier Circuit

Figure 9:
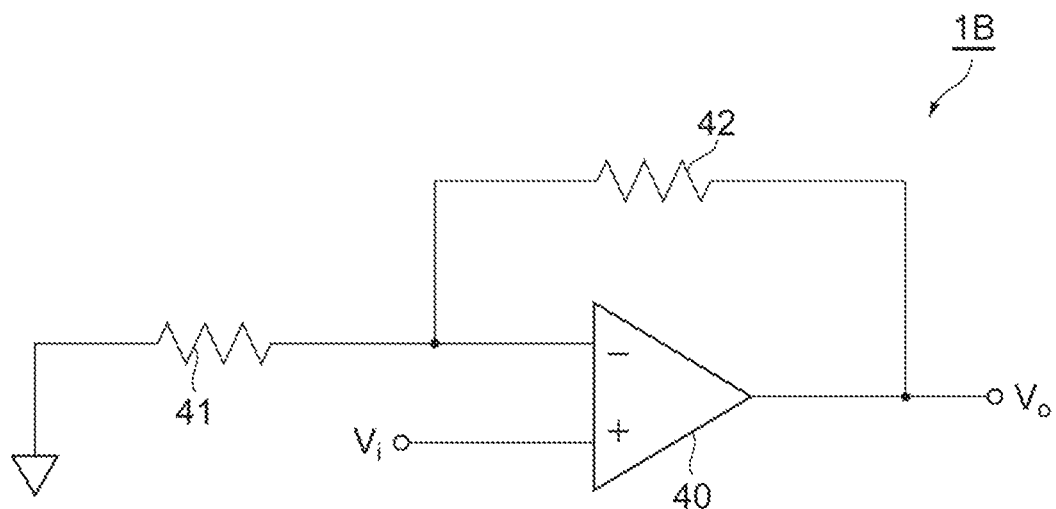
FIG. 9 is a circuit diagram showing a variable gain amplifier circuit according to the second configuration example.

FIG. 9 is a circuit diagram showing a variable gain amplifier circuit 1B according to the second configuration example. The variable gain amplifier circuit 1B includes an operational amplifier 40 and resistors 41 and 42. A non-inverting input terminal of the operational amplifier 40 is connected to an input terminal of the variable gain amplifier circuit 1B. The resistor 41 is provided between an inverting input terminal of the operational amplifier 40 and a ground potential input terminal. The resistor 42 is provided between the inverting input terminal of the operational amplifier 40 and an output terminal of the operational amplifier 40. The output terminal of the operational amplifier 40 is connected to the output terminal of the variable gain amplifier circuit 1B.

A value Vo of a voltage signal output from the outputted terminal becomes the value corresponding to a value Vi of the voltage signal inputted to the input terminal, a resistance value $r_{41}$ of the resistor 41 and a resistance value $r_{42}$ of the resistor 42. The output voltage value Vo is expressed by the following equation (8).

$$Vo = \left(1 + \frac{r_{42}}{r_{41}}\right) Vi \tag{8}$$

Both or one of the resistor 41 and the resistor 42 has the configuration of the combined resistance circuit described above. As a result, the variable gain amplifier circuit 1B becomes a non-inverting amplifier circuit in which the gain is variably set.

Third Configuration Example of Variable Gain Amplifier Circuit

Figure 10:
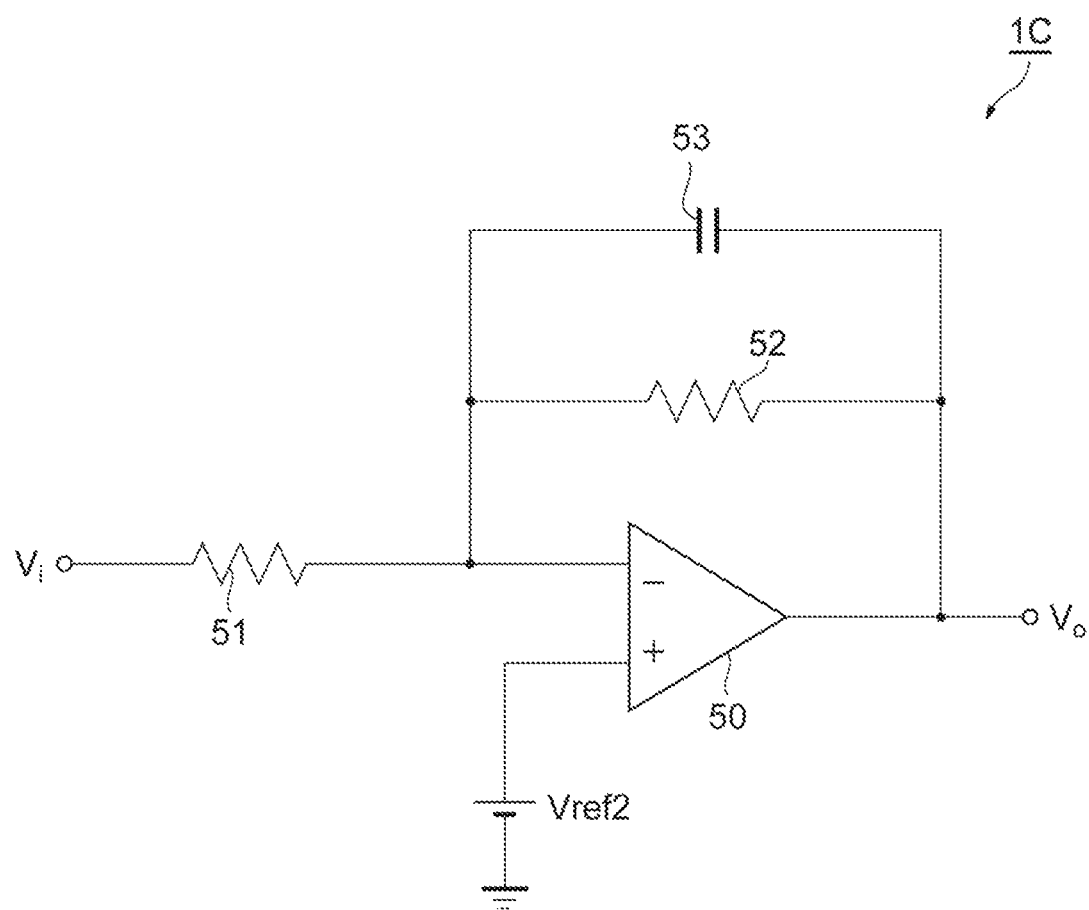
FIG. 10 is a circuit diagram showing a variable gain amplifier circuit according to the third configuration example.

FIG. 10 is a circuit diagram showing a variable gain amplifier circuit 1C according to the third configuration example. The variable gain amplifier circuit 1C includes an operational amplifier 50, resistors 51 and 52, and a capacitor 53. A non-inverting input terminal of the operational amplifier 50 is input by a reference potential Vref2. The resistor 51 is provided between an inverting input terminal of the operational amplifier 50 and an input terminal of the variable gain amplifier circuit 1C. The resistor 52 and the capacitor 53 are connected in parallel to each other and are provided between the inverting input terminal of the operational amplifier 50 and an output terminal of the operational amplifier 50. The output terminal of the operational amplifier 50 is connected to the output terminal of the variable gain amplifier circuit 1C.

A value Vo of a voltage signal outputted from the output terminal becomes a value corresponding to a value Vi of the voltage signal inputted to the input terminal, a resistance value $r_{51}$ of the resistor 51, a resistance value $r_{52}$ of the resistor 52, and a capacitance value C53 of the capacitor 53. The output voltage value Vo is expressed by the following equation (9). The symbol j denotes an imaginary unit and the symbol ω denotes an angular frequency. The output voltage value becomes a value obtained by integrating the input voltage value with respect to time.

$$Vo = -\frac{r_{52}}{r_{51}(1 + j\omega C_{53} r_{52})} Vi \qquad (9)$$

Both or one of the resistor 51 and the resistor 52 has the configuration of the combined resistance circuit described above. As a result, the variable gain amplifier circuit 1C becomes an integrating circuit of which gain is variably set.

Fourth Configuration Example of Variable Gain Amplifier Circuit

Figure 11:
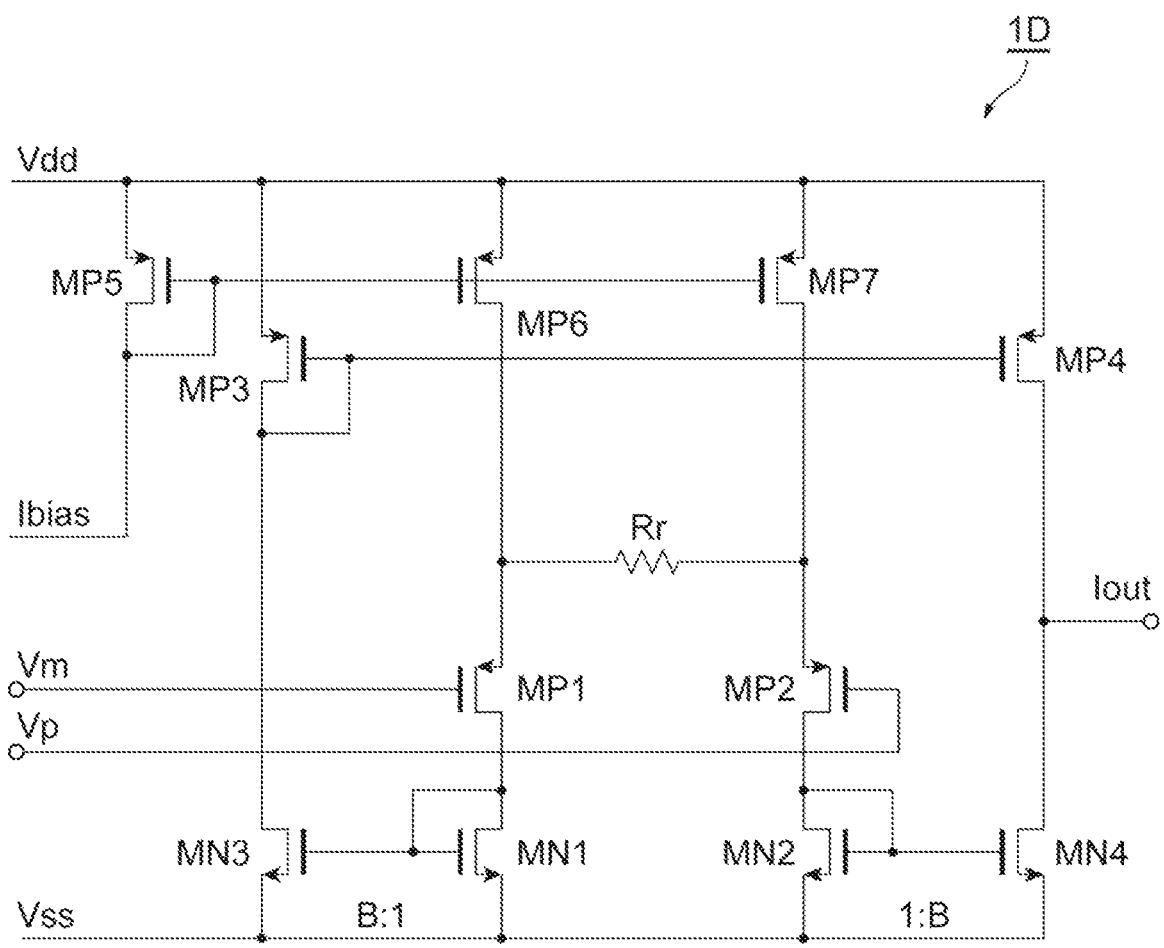
FIG. 11 is a circuit diagram showing a variable gain amplifier circuit according to the fourth configuration example.

FIG. 11 is a circuit diagram showing a variable gain amplifier circuit 1D according to the fourth configuration example. The variable gain amplifier circuit 1D includes PMOS transistors MP1 to MP7, NMOS transistors MN1 to MN4, and a resistor Rr.

A voltage value Vm is inputted to a gate of the PMOS transistor MP1. A source of the PMOS transistor MP1 is connected to a drain of the PMOS transistor MP6. A drain of the PMOS transistor MP1 is connected to the drain of the NMOS transistor MN1. A voltage value Vp is inputted to a gate of the PMOS transistor MP2. The source of the PMOS transistor MP2 is connected to a drain of the PMOS transistor MP7. The drain of the PMOS transistor MP2 is connected to a drain of the NMOS transistor MN2.

A power supply potential Vdd is inputted to each source of the PMOS transistors MP3 to MP7. A gate of the PMOS transistor MP3 and a gate of the PMOS transistor MP4 are connected to a drain of the PMOS transistor MP3. A drain of the PMOS transistor MP3 is connected to a drain of the NMOS transistor MN3. A drain of the PMOS transistor MP4 is connected to a drain of the NMOS transistor MN4. A bias current Ibias is inputted to each gate of the PMOS transistors MP5 to MP7 and the drain of the PMOS transistor MP5.

A ground potential Vss is inputted to each source of the NMOS transistors MN1 to MN4. The gates of the NMOS transistors MN1 and MN3 are connected to the drain of the NMOS transistor MN1. The gates of the NMOS transistors MN2 and MN4 are connected to the drain of the NMOS transistor MN2.

The resistor Rr is provided between the source of the PMOS transistor MP1 and the source of the PMOS transistor MP2. The output terminal of the variable gain amplifier circuit 1D is a connection point between the drain of the PMOS transistor MP4 and the drain of the NMOS transistor MN4.

An amount of current Ir flowing through the resistor Rr is proportional to the potential difference at both ends thereof. Since the amount of current flowing through each of the PMOS transistors MP6 and MP7 is the same, the amount of current flowing through the PMOS transistor MP1 increases by Ir and the amount of current flowing through the PMOS transistor MP2 decreases by Ir. While the amount of current Ir is small, the change in the potential difference Vgs between the gate and the source of the PMOS transistors MP1 and MP2 by this is small. While the difference (Vp−Vm) in the input voltage value is small, the potential of each source of the PMOS transistors MP1 and MP2 increases from the gate voltage by substantially the same Vgs. Therefore, the potential difference at both ends of the resistor Rr is Vp−Vm, and the amount of current Ir flowing through the resistor Rr is expressed by the following equation (10).

$$Ir = (Vp - Vm)/Rr \qquad (10)$$

The PMOS transistors MP3 and MP4 constitute a current mirror circuit. The NMOS transistors MN1 and MN3 constitute a current mirror circuit. The NMOS transistors MN2 and MN4 constitute a current mirror circuit. An amount of current flowing through the NMOS transistor MN1 is the same as an amount of current flowing through the PMOS transistor MP1 and is increased by Ir. An amount of current flowing through the NMOS transistor MN2 is the same as an amount of current flowing through the PMOS transistor MP2 and is decreased by Ir. The current flowing through the NMOS transistor MN1 is looped back by the current mirror circuit and becomes the current injected into the PMOS transistor MP4 as it is. A value Iout of a current signal outputted from the output terminal becomes a value corresponding to a difference between the current injected into the PMOS transistor MP4 and the current sunk by the NMOS transistor MN4. When the mirror ratio is B in the current mirror circuit, Iout is expressed by the following equation (11).

$$Iout = 2B \cdot Ir \qquad (11)$$

The resistor Rr has the configuration of the combined resistance circuit described above. As a result, the variable gain amplifier circuit 1D becomes a VI converting circuit in which the gain is variably set.

Modification Example of Variable Gain Amplifier Circuit

The variable gain amplifier circuit of the present invention is not limited to the variable gain amplifier circuits 1A to 1D of the first to fourth configuration examples and various modifications are possible. Variable gain amplifier circuits have various configurations, but many variable gain amplifier circuits include operational amplifiers and resistors, and outputs an electrical signal having a value corresponding to the value of the input electrical signal and the resistance value of the resistor. The combined resistance circuit of the present invention may be used in any configuration of the variable gain amplifier circuit.

In the embodiment described above, it is possible to refer to each element such as a node, a resistor, and the like by assigning numbers such as first, second, and the like. In this case, the combined resistance circuit including the first circuitry includes the first circuitry provided between a first end and a second end, in which the first circuitry includes: a first resistor R1 provided between the first node N11 and a second node N12, a second resistor R2 provided between the second node N12 and a third node N13, a third resistor R3 provided between the third node N13 and a fourth node N14, a fourth resistor R4 provided between the fourth node N14 and the first node N11, a fifth resistor R5 provided between the first node N11 and the third node N13, a first switch SW0 provided in series to the fourth resistor R4 between the fourth node N14 and the first node N11, a second switch SW1 provided in series to the second resistor R2 between the second node N12 and the third node N13, and the second node N12 is connected to the first end, and the fourth node N14 is connected to the second end. Further, in the second to fourth circuitries, they may be numbered in the same way.

What is claimed is:

1. A combined resistance circuit comprising:
   a first circuitry provided between a first end and a second end,
   wherein the first circuitry includes
   a first resistor (R1) provided between a first node (N11) and a second node (N12),
   a second resistor (R2) provided between the second node (N12) and a third node (N13),
   a third resistor (R3) provided between the third node (N13) and a fourth node (N14),
   a fourth resistor (R4) provided between the fourth node (N14) and the first node (N11),
   a fifth resistor (R5) provided between the first node (N11) and the third node (N13),
   a first switch (SW0) provided in series to the fourth resistor (R4) between the fourth node (N14) and the first node (N11), and
   a second switch (SW1) provided in series to the second resistor (R2) between the second node (N12) and the third node (N13),
   the second node (N12) is connected to the first end, and the fourth node (N14) is connected to the second end.

2. The combined resistance circuit according to claim 1, wherein a resistance ratio $r_3/r_1$ and a resistance ratio $r_4/r_2$ are equal to each other, where,
   $r_1$ indicates a resistance value of the first resistor (R1),
   $r_2$ indicates a resistance value of the second resistor (R2),
   $r_3$ indicates a resistance value of the third resistor (R3), and
   $r_4$ indicates a resistance value of the fourth resistor (R4).

3. The combined resistance circuit according to claim 1, further comprising:
   a second circuitry provided in parallel to the first circuitry between the first end and the second end,
   wherein the second circuitry includes
   a sixth resistor (R6) provided between a fifth node (N21) and a sixth node (N22),
   a seventh resistor (R7) provided between the sixth node (N22) and a seventh node (N23),
   an eighth resistor (R8) provided between the seventh node (N23) and an eighth node (N24),
   a ninth resistor (R9) provided between the eighth node (N24) and the fifth node (N21),
   a tenth resistor (R10) provided between the fifth node (N21) and the seventh node (N23),
   a third switch (SW2) provided in series to the sixth resistor (R6) between the fifth node (N21) and the sixth node (N22),
   a fourth switch (SW3) provided in series to the ninth resistor (R9) between the eighth node (N24) and the fifth node (N21), and
   a fifth switch (SW4) provided in series to the seventh resistor (R7) between the sixth node (N22) and the seventh node (N23),
   the sixth node (N22) is connected to the first end, and the eighth node (N24) is connected to the second end.

4. The combined resistance circuit according to claim 1, further comprising:
   a third circuitry provided in parallel to the first circuitry between the first end and the second end,
   wherein the third circuitry includes
   a sixth resistor (R6) provided between a fifth node (N21) and a sixth node (N22),
   a seventh resistor (R7) provided between the sixth node (N22) and a seventh node (N23),
   an eighth resistor (R8) provided between the seventh node (N23) and an eighth node (N24),
   a ninth resistor (R9) provided between the eighth node (N24) and the fifth node (N21),
   a tenth resistor (R10) provided between the fifth node (N21) and the seventh node (N23),
   a third switch (SW2) provided in series to the tenth resistor (R10) between the fifth node (N21) and the seventh node (N23),
   a fourth switch (SW3) provided in series to the ninth resistor (R9) between the eighth node (N24) and the fifth node (N21), and
   a fifth switch (SW4) provided in series to the seventh resistor (R7) between the sixth node (N22) and the seventh node (N23),
   the sixth node (N22) is connected to the first end, and the eighth node (N24) is connected to the second end.

5. The combined resistance circuit according to claim 1, further comprising: a fourth circuitry provided in parallel to the first circuitry between the first end and the second end,
   wherein the fourth circuitry includes
   a sixth resistor (R6) provided between a fifth node (N21) and a sixth node (N22),
   a seventh resistor (R7) provided between the sixth node (N22) and a seventh node (N23),
   an eighth resistor (R8) provided between the seventh node (N23) and an eighth node (N24),
   a ninth resistor (R9) provided between the eighth node (N24) and the fifth node (N21),
   a tenth resistor (R10) provided between the fifth node (N21) and the seventh node (N23),
   a third switch (SW2) provided between the eighth node (N24) and the second end,
   a fourth switch (SW3) provided in series to the ninth resistor (R9) between the eighth node (N24) and the fifth node (N21), and
   a fifth switch (SW4) provided in series to the seventh resistor (R7) between the sixth node (N22) and the seventh node (N23), and
   the sixth node (N22) is connected to the first end.

6. A variable gain amplifier circuit, comprising:
   the combined resistance circuit according to claim 1,
   wherein the variable gain amplifier circuit outputs an electrical signal having a value corresponding to a value of an input electrical signal and a combined resistance value of the combined resistance circuit.

* * * * *